United States Patent
Chen et al.

(10) Patent No.: US 7,132,882 B2
(45) Date of Patent: Nov. 7, 2006

(54) AMPLIFIER HAVING MULTIPLE OFFSET-COMPENSATION PATHS AND RELATED SYSTEMS AND METHODS

(75) Inventors: Wei-yung Chen, San Jose, CA (US); Michael A. Robinson, Fremont, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 467 days.

(21) Appl. No.: 10/198,851

(22) Filed: Jul. 19, 2002

(65) Prior Publication Data

US 2004/0012439 A1 Jan. 22, 2004

(51) Int. Cl.
*H03F 1/02* (2006.01)

(52) U.S. Cl. .................. 330/9; 330/259; 330/308

(58) Field of Classification Search .................. 330/9, 330/98, 99, 100, 252, 260, 308, 310, 259; 327/307; 359/189

See application file for complete search history.

(56) References Cited

U.S. PATENT DOCUMENTS

| | | | |
|---|---|---|---|
| 4,724,315 A * | 2/1988 | Goerne .................. 250/214 A |
| 6,018,407 A * | 1/2000 | Hatakeyama et al. ....... 398/209 |
| 6,140,872 A * | 10/2000 | McEldowney ................. 330/9 |
| 6,552,605 B1 * | 4/2003 | Yoon .............................. 330/9 |

* cited by examiner

*Primary Examiner*—Steven J. Mottola

(57) ABSTRACT

An amplifier includes an amplification path and multiple offset-compensation feedback paths. The amplification path has multiple amplifier stages, and the feedback paths are coupled to the amplification path. By including multiple feedback paths, such an amplifier can maintain its output DC-offset voltage at a desired level over a full range of amplitudes, i.e., power, of the input signal.

26 Claims, 5 Drawing Sheets

AMPLIFIER HAVING MULTIPLE OFFSET-COMPENSATION PATHS AND RELATED SYSTEMS AND METHODS

BACKGROUND OF THE INVENTION

High-gain multistage amplifiers are often used to amplify signals having relatively small amplitudes, i.e., having relatively low power. For example, such amplifiers are typically used to amplify signals received via optical fibers.

But without adequate offset compensation, such multistage amplifiers often have relatively large output DC-offset voltages. Specifically, each stage of a high-gain amplifier typically generates an unwanted low-frequency, i.e., direct-current (DC), offset voltage at its output node(s). This output DC-offset voltage is defined as a stage's output voltage when the stage's input voltage is 0 Volts (V). Typically, the ideal output DC-offset voltage for a single-ended stage is half way between the stage's supply voltages, and the ideal output DC-offset voltage for a differential stage is 0V. Such an ideal DC-offset voltage allows the stage to generate an amplified high-frequency, i.e., alternating-current (AC), output signal having the largest unclipped peak-to-peak voltage possible for a given set of supply voltages. But if the output DC-offset voltage has a non-ideal level, then the AC output signal's maximum peak-to-peak voltage is reduced by twice the difference between the actual and ideal levels of the DC-offset voltage. For example, suppose a single-ended amplifier stage has +5V and −5V power supplies and an output-voltage range of +4V and −4V. If the stage's DC-offset voltage is an ideal 0V (halfway between +5V and −5V), then the stage can generate an amplified output signal having a peak-to-peak voltage as large as 8V. But if the DC-offset voltage is +1V, then the output signal's maximum peak-to-peak voltage is reduced to 6V. In a multistage amplifier, each latter stage amplifies the DC-offset voltage of each former stage. Therefore, even in amplifiers with relatively few stages having relatively low DC-offset voltages, the cumulative DC-offset voltage at the output of the last stage can be quite large.

Consequently, to maintain the output DC-offset voltage at a desirable level, a multistage amplifier typically includes an offset-compensation circuit. A common type of offset-compensation circuit uses negative feedback to maintain the output DC-offset voltage at a desirable level.

But unfortunately, as discussed below in conjunction with FIGS. 1 and 2, available offset-compensation circuits typically cannot provide desired levels of compensation over a large range of input-signal power or over a large range of amplifier gains.

FIG. 1 is a block diagram of a conventional differential high-gain multistage amplifier 10 that generates an output signal Vout by amplifying an input signal Vin and that includes a feed-forward amplification path 12 and a single offset-compensation path 14.

The amplification path 12 includes serially coupled differential amplifier stages $16_1$, $16_2$, ..., and $16_n$, which have respective input DC-offset voltages $Voffin_1$, $Voffin_2$, ..., and $Voffin_n$ and which generate output DC-offset voltages $Voffout_1$, $Voffout_2$, ..., and $Voffout_n$. Each stage 16 has a respective pair of differential input nodes 18a and 18b and a respective pair of differential output nodes 20a and 20b. In addition, the stage $16_1$ has a pair of differential offset-adjust nodes $22a_1$ and $22b_1$. A common technique for modeling the input DC offsets $Voffin_1$, $Voffin_2$, ..., and $Voffin_n$ is to include DC-offset sources $24_1$, $24_2$, ..., $24_n$, which are serially coupled to the input nodes $18a_1$, $18a_2$, ..., and $18a_n$, respectively. Therefore, $Voffout_1 = Voffin_1 \times Gdc16_1$, $Voffout_2 = (Voffout_1 + Voffin_2) \times Gdc16_2$, ..., and $Voffout_n = (Voffout_{n-1} + Voffin_n) \times Gdc16_n$, where $Gdc16_1$, $Gdc16_2$, ..., and $Gdc16_n$ represent the DC gains of the amplifier stages $16_1$, $16_2$, ..., $16_n$, respectively. Consequently, a relatively small input DC-offset voltage generated by a stage at the front end of the amplifier 10 can cause a relatively large DC-offset voltage $Voffout_n$ across the amplifier's output nodes $20a_n$ and $20b_n$. For example, if the number of stages n=3, $Voffin_1$=1 nanoVolt (nV), and $Gdc16_1$, $Gdc16_2$, and $Gdc16_3$=1000, then $Voffout_3$=1 nV×1000×1000×1000 1 V, which is often too large for proper operation of the amplifier 10.

Furthermore, the amplifier stages $16_1$, $16_2$, ..., $16_n$ amplify Vin to generate respective output voltages of interest $Vsout_1$, $Vsout_2$, and $Vsout_n$. Therefore, assuming that Vin is an AC signal, $Vsout_1 = Vin \times Gac16_1$, $Vsout_2 = Vsout_1 \times Gac16_2$, ..., and $Vsout_n = Vsout_{n-1} \times Gac16_n$, where $Gac16_1$, $Gac16_2$, and $Gac16_n$ are the AC gains of the stages $16_1$, $16_2$, ..., and $16_n$, respectively.

Consequently, if the output DC-offset voltage Voffout of an amplifier stage 16 is too high, then the stage may clip the output voltage Vsout of interest. Using the well-known superposition theorem, the combined output voltages generated by the stages $16_1$, $16_2$, ..., and $16_n$, respectively, are $Vsout_1 + Voffout_1$, $Vsout_2 + Voffout_2$, ..., and $Vsout_n + Voffout_n$ = Vout. Therefore, the signal components of interest $Vsout_1$–$Vsout_n$ "ride" on the offset components $Voffout_1$–$Voffout_n$, respectively. For example, suppose that $Voffout_n$ is an ideal 0 V and that the differential peak-to-peak range of the last stage 16n is 4 V. Therefore, if $Vsout_n$ is a sinusoid with a peak-to-peak amplitude of 3 V, then the stage $16_n$ generates $Vsout_n$ with no clipping. But if $Voffout_n$=1 V, then the stage $16_n$ will clip $Vsout_n$.

To reduce the output DC-offset voltage of the amplifier stages 16 to acceptable levels so as to prevent clipping, the amplifier 10 includes the feedback compensation path 14, which includes a compensator 26 for maintaining the output DC-offset voltage of a selected stage 16—here the stage $16_2$—at a predetermined level. Specifically, the compensator 26 receives the output DC-offset voltage of the selected stage $16_2$ on differential input nodes 28a and 28b, generates on output nodes 29a and 29b a differential correction signal OFFSET ADJUST having a value that is related to the level of the received DC offset, and provides OFFSET ADJUST to a prior stage 16—here the first stage $16_1$. OFFSET ADJUST alters the output DC-offset voltage of the prior stage $16_1$ so as to maintain the output DC offset of the selected stage $16_2$ at the predetermined level. More specifically, in the example shown in FIG. 1, the compensator 26 is a high-gain amplifier that uses negative feedback to maintain the output DC-offset voltage of the stage $16_2$ at or near 0 V. The compensator 26 receives the output voltage $Vsout_2 + Voffout_2$ from the output nodes $20a_2$ and $20b_2$ of the stage $16_2$. Because the purpose of the compensator 26 is to control the level of $Voffout_2$, it filters out the higher-frequency component $Vsout_2$ with a low-pass filter (not shown in FIG. 1) to isolate $Voffout_2$. Then, it generates OFFSET ADJUST from the isolated $Voffout_2$ and provides OFFSET ADJUST to the adjust terminals $22a$ and $22b$ of the first stage $16_1$. In response to OFFSET ADJUST, the stage $16_1$ adjusts its output DC-offset voltage $Voffout_1$ to a level that causes $Voffout_2$ to equal or approximately equal 0 V.

Although the feedback path 14 can maintain the output DC-offset voltage $Voffout_2$ of the selected amplifier $16_2$ at a desired level, the last amplifier stage $16_n$ may generate an undesirably large output DC-offset voltage $Voffout_n$, particularly when Vsout$_n$ is relatively low power. This is because Voffout$_n$ may overpower Vsout$_n$, thus making Vsout$_n$ difficult to recover. Such low-power Vsout$_n$ is typically caused by Vin having a relatively low power.

FIG. 2 is a block diagram of an amplifier 30 that attempts to solve this problem by replacing the single feedback path 14 with a single feedback path 32 that is connected to the output nodes 20a$_n$ and 20b$_n$ of the last stage 16$_n$. Except for the different feedback path 32, the amplifier 30 is the same as the amplifier 10 of FIG. 1 and thus like numbers are used to reference like components in FIGS. 1 and 2.

In operation, the compensator 26 receives the differential output voltage Vsout$_n$+Voffout$_n$ from the output nodes 20a$_n$ and 20b$_n$ of the last stage 16$_n$, filters out the higher-frequency component Vsout$_n$ to isolate Voffout$_n$, generates OFFSET ADJUST from the isolated Voffout$_n$, and provides OFFSET ADJUST to the first stage 16$_1$. In response to OFFSET ADJUST, the stage 16$_1$ adjusts its output DC-offset voltage Voffout$_1$ to a level that causes Voffout$_n$ to equal or approximately equal 0 V.

But a problem with the amplifier 30 is that the output-signal component Vsout$_n$ may be so large that the compensator 26 cannot accurately adjust the DC offset Voffout$_n$ to a desired level. A large Vsout$_n$ is typically caused by a high-power input signal Vin. As discussed above in conjunction with FIG. 1, if Voffout$_n$ and Vsout$_n$ are too large, then the stage 16$_n$ may clip Vsout$_n$. But if the stage 16$_n$ clips Vsout$_n$, then low-pass filtering Vout yields the DC component of the clipped Vsout$_n$, not the true DC offset Voffout$_n$. Therefore, the compensator 26 isolates this DC component instead of Voffout$_n$, and thus erroneously generates OFFSET ADJUST from this isolated component. Consequently, because OFFSET ADJUST is inaccurate, the stage 16$_1$ typically does not adjust Voffout$_1$ to a value that causes Voffout$_n$ to equal or approximately equal a desired level such as 0 V.

Therefore, referring to FIGS. 1 and 2, although the offset-compensation path 14 renders the amplifier 10 well suited for a relatively large voltage signal Vsout$_n$ and the offset-compensation path 32 renders the amplifier 30 well suited for a relatively small Vsout$_n$, neither the amplifier 10 nor the amplifier 30 works well over an entire of amplitudes for Vsout$_n$. And because the amplitude of Vsout$_n$ is proportional to the power of Vin neither the amplifier 10 nor the amplifier 30 works well over an entire range of powers for Vin.

SUMMARY OF THE INVENTION

In one embodiment of the invention, an amplifier includes an amplification path and multiple offset-compensation feedback paths. The amplification path has multiple amplifier stages, and the feedback paths are multiple loops coupled to the amplification path.

By including multiple offset-compensation feedback paths, such an amplifier can maintain its output DC-offset voltage at a desired level regardless of the amplitude, i.e., power, of the input signal.

DESCRIPTION OF THE INVENTION

The following discussion is presented to enable a person skilled in the art to make and use the invention. Various modifications to the disclosed embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

Figure 1:
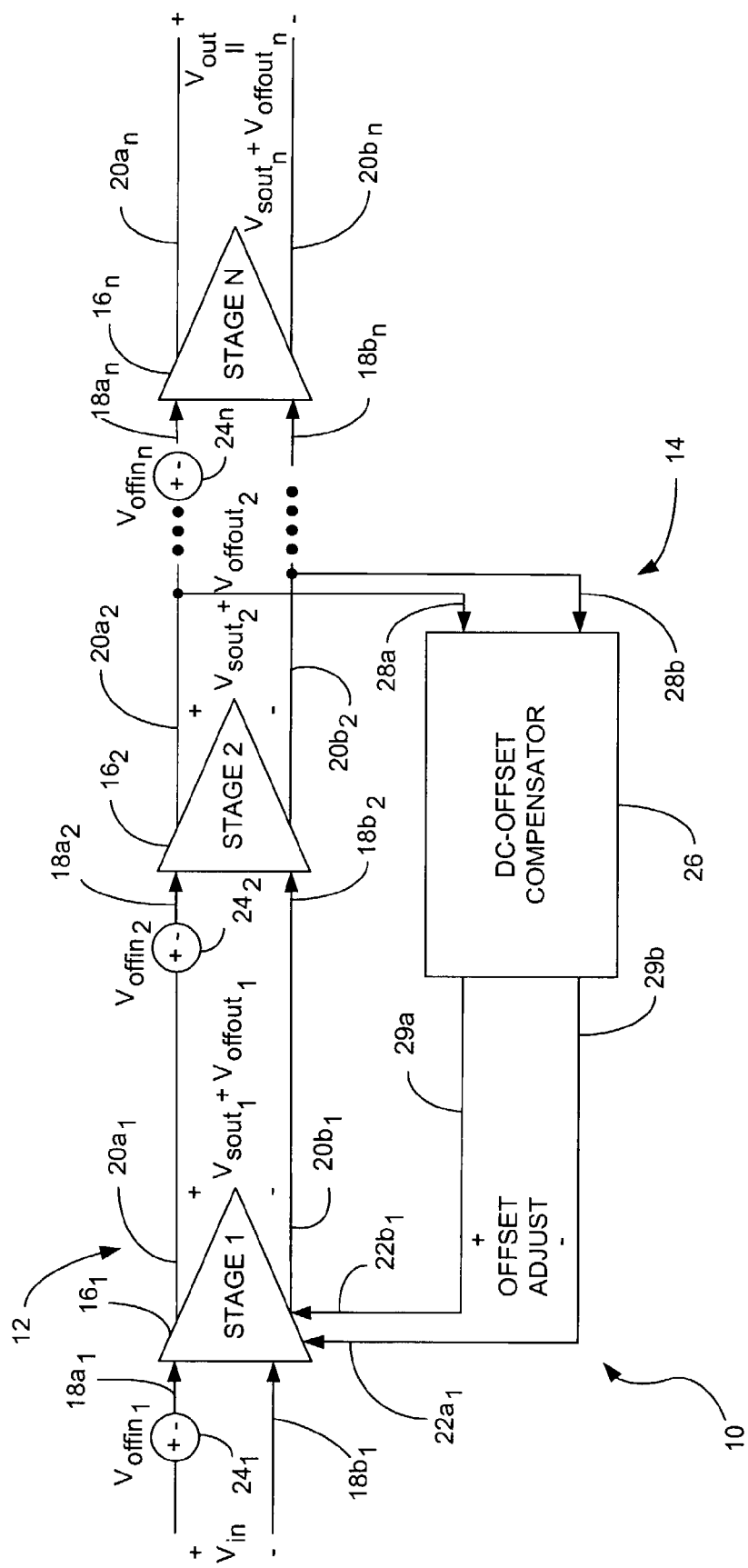
FIG. 1 is a block diagram of a conventional multistage amplifier having an offset-compensation feedback path that makes the amplifier suitable for a high-power input signal.
Figure 2:
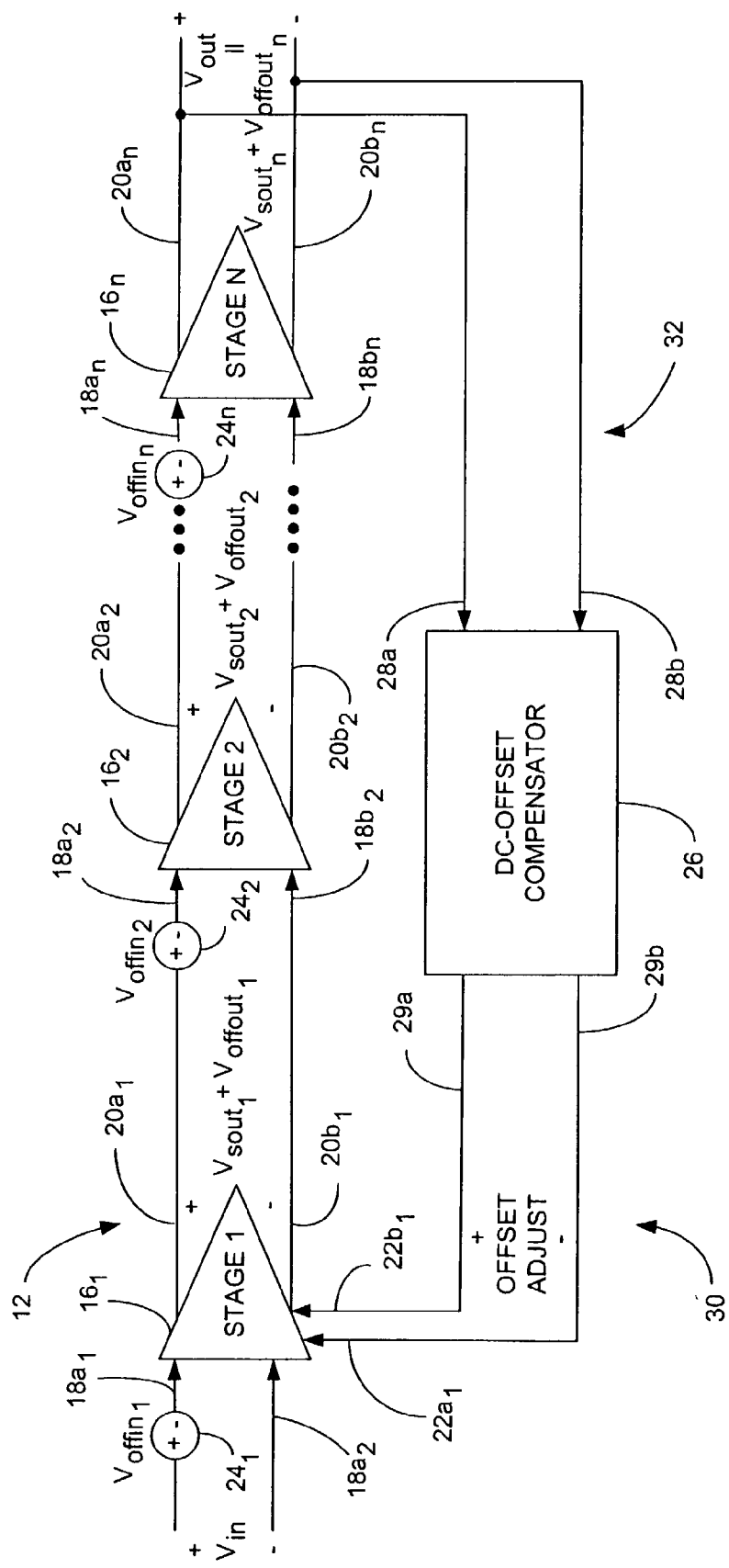
FIG. 2 is a block diagram of a conventional multistage amplifier having a different offset-compensation feedback path that makes the amplifier suitable for a low-power input signal.
Figure 3:
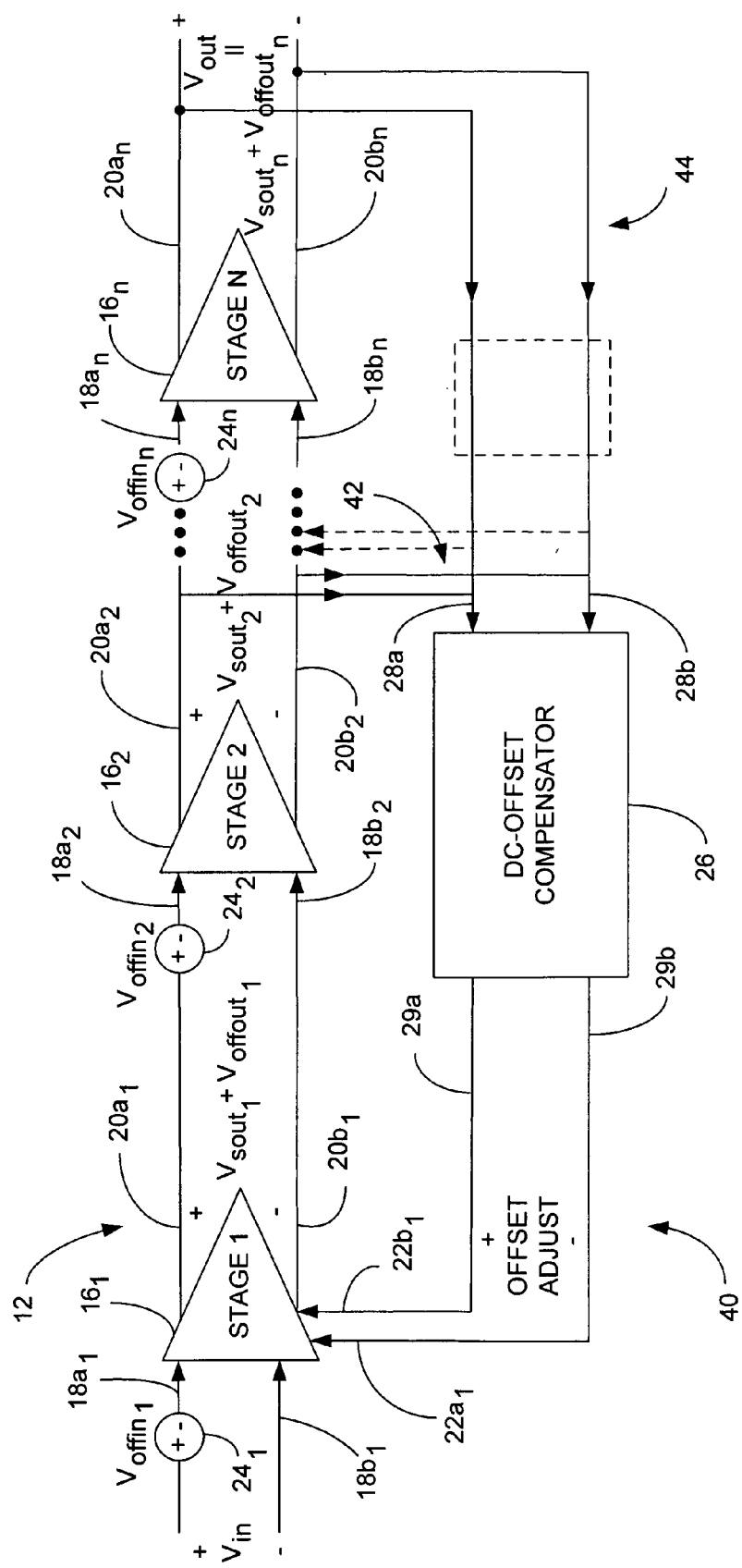
FIG. 3 is a block diagram of a multistage amplifier having multiple offset-compensation feedback paths that make the amplifier suitable for both low- and high-power input signals according to an embodiment of the invention.

FIG. 3 is a block diagram of a differential high-gain multistage amplifier 40 that includes multiple feedback offset-compensation paths 42 and 44 according to an embodiment of the invention. The multiple feedback paths can maintain the output DC-offset Voffout$_n$ at a desired level over a full range of input-signal power. Except for the multiple feedback paths, the amplifier 40 is similar to the amplifiers 10 and 30 of FIGS. 1 and 2, respectively, and thus like numbers are used to reference like components in FIGS. 1, 2, and 3.

In one embodiment, the offset-compensation path 42 is a high-power path and the path 44 is a low-power path. The path 42 includes the compensator 26 and is otherwise the same as the feedback path 14 of FIG. 1, and thus can maintain Voffout$_n$ at or approximately at a desired level such as 0 V when Vin has relatively high-power. Likewise, the path 44 includes the compensator 26 and is otherwise the same as the feedback path 32 of FIG. 2, and thus can maintain Voffout$_n$ at or approximately at a desired level such as 0 V when Vin has a relatively low-power.

In operation, the compensator 26 receives the signals Vsout$_2$+Voffout$_2$ and Vsout$_n$+Voffout$_n$ from the outputs of the stages 16$_2$ and 16$_n$, respectively, low-pass filters these signals to isolate the offset components Voffout$_2$ and Voffout$_n$, and generates OFFSET ADJUST in response to these isolated components. In response to OFFSET ADJUST, the stage 16$_1$ adjusts the level of Voffout$_1$ so as to maintain Voffout$_2$ and Voffout$_n$ at or near desired levels such as 0 V.

Still referring to FIG. 3, other embodiments of the amplifier 40 are contemplated. For example, although the amplifier 40 is shown including two feedback paths 42 and 44, it may include more than two feedback paths. Furthermore, although OFFSET ADJUST is shown coupled to the offset-adjust nodes of the stage 16$_1$, this signal may coupled to the input nodes 18a$_1$ and 18b$_1$ of the stage 16$_1$ or to the input or offset-adjust nodes (not shown) of the stage 16$_2$. In addition, although shown coupled to the output nodes 20a$_2$, 20b$_2$, 20a$_n$ and 20b$_n$ of the stages 16$_2$ and 16$_n$, the input nodes 28a and 28b of the compensator 26 may be coupled to the output nodes of other stages 16. Moreover, although discussed as maintaining an offset voltage at a desired level, the paths 42 and 44 may be designed to maintain an offset current at a desired level. Furthermore, although shown as sharing the same compensator 26, each of the feedback paths 42 and 44 may include respective compensators (as indicated by the dashed box in FIG. 3), and the output nodes of these compensators may be coupled to different amplifier stages 16. In addition, although shown as overlapping, the paths 42 and 44 may be non-overlapping. For example, the path 42 may be connected to the stages 16$_1$ and 16$_2$ as shown, and the path 44 may be connected (as indicated by the dashed arrows in FIG. 3) to the stages 16$_{n-1}$ (not shown) and 16$_n$. Moreover, the paths 42 and 44 may maintain an offset voltage that the compensator 26 does not receive on the nodes 28a and 28b at or approximately at a desired level.

Figure 4:
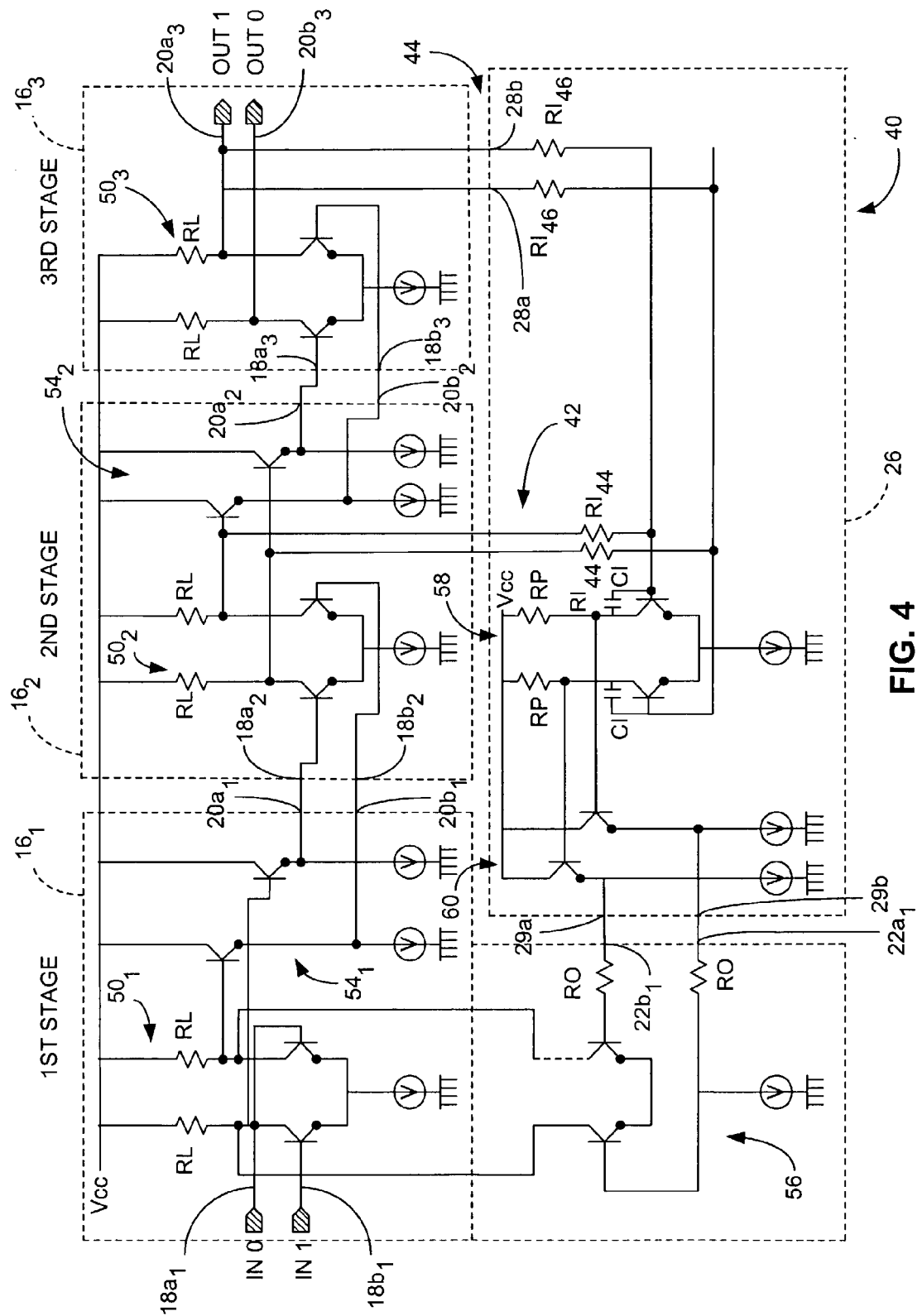
FIG. 4 is a schematic diagram of an embodiment of the amplifier of FIG. 3 according to an embodiment of the invention.

FIG. 4 is a schematic diagram of the amplifier 40 of FIG. 3 according to an embodiment of the invention. In this embodiment, the amplifier 40 includes three stages 16$_1$–16$_3$ and the feedback paths 42 and 44 are coupled between the output nodes 20a$_2$, 20b$_2$ and 20a$_3$, 20b$_3$ of the second and third stages 16$_2$ and 16$_3$, respectively, and the offset-adjust nodes 22a$_1$ and 22b$_1$ of the first stage 16$_1$. Each of the stages 16 includes a respective differential input stage 50 having load resistors RL, and the stages 16$_1$ and 16$_2$ include differential output stages 54$_1$ and 54$_2$. The stage 16$_1$ also includes a differential offset-adjust stage 56, which has a gain that is set in part by offset-adjust resistors RO. In one example, the load resistors RL=1 KΩ, the offset-adjust resistors RO=10 KΩ, and the bandwidth of the amplification path 12 is or is approximately 1 GigaHertz (GHz). The compensator 26 includes an input stage 58 and an output stage 60. The input stage 58 includes input resistors RI$_{44}$ and RI$_{46}$, filter capacitors CI, and load resistors RP, which set the compensator's gain and low-pass-filtering bandwidth. In one example, the resistors RI$_{44}$=RI$_{46}$=100 KΩ, the capacitors CI=20$_0$ picoFarad (pF), and the resistors RP=5 KΩ, giving the compensator 26, and thus each of the paths 42 and 44, a low-pass-filtering bandwidth of approximately 100 KHz. Therefore, in this example, the compensator 26 can compensate for DC-offset voltages Voffout$_2$ and Voffout$_3$ having frequencies from approximately 0–1 KHz. In another embodiment, the resistors RI$_{44}$≠RI$_{46}$ to give different gains to the paths 42 and 44.

Figure 5:
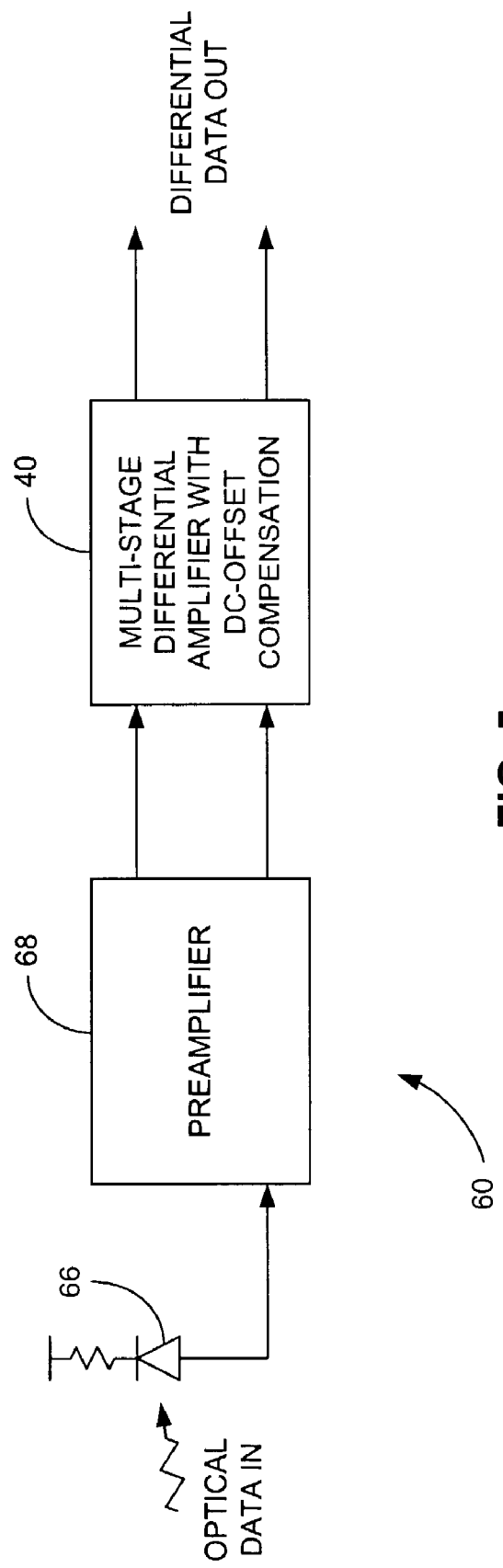
FIG. 5 is a block diagram of a fiber-optic receiver that incorporates the amplifier of FIG. 3 according to an embodiment of the invention.

FIG. 5 is a block diagram of a fiber-optic receiver 60 that incorporates the amplifier 40 of FIG. 3 according to an embodiment of the invention. The receiver 60 includes a photo diode 66, a preamplifier 68, and the amplifier 40. The diode 66 receives an optical data signal from an optical fiber (not shown) and converts this optical signal into a single-ended electrical data signal. The preamplifier 68 amplifies the electrical data signal and converts it into a differential electrical data signal, and the amplifier 40 further amplifies this differential data signal as discussed above in conjunction with FIG. 3.

We claim:

1. An amplifier, comprising:
   an amplification path that includes multiple differential stages each having respective input nodes and output nodes; and
   multiple differential offset-compensation feedback paths having respective input nodes coupled to respective locations of the amplification path, at least two of the paths having substantially the same time constant, at least one of the paths having an input node coupled to an output node of a second one of the stages and having an output node coupled to an input node of a first one of the stages that precedes the second one of the stages.

2. An amplifier, comprising:
   an amplification path that includes multiple differential stages;
   multiple differential offset-compensation feedback paths having respective input nodes coupled to respective locations of the amplification path, at least two of the paths having substantially the same time constant;
   wherein a first one of the offset-compensation paths is coupled between a first stage and a second stage; and
   wherein a second one of the offset-compensation paths is coupled between the first stage and a third stage.

3. An amplifier, comprising:
   an amplification path that includes multiple stages each having a respective output node;
   a first offset compensation feedback path having an input node coupled to the output node of a first one of the stages and having an output node coupled to a second one of the stages; and
   a second offset compensation feedback path having an input node coupled to the output node of a third one of the stages and having an output node coupled to a fourth one of the stages.

4. The amplifier of claim 3 wherein the first offset compensation feedback path overlaps the second offset compensation feedback path.

5. The amplifier of claim 3 wherein the fourth stage is the same as the second stage.

6. The amplifier of claim 3 wherein the first, second, third, and fourth stages of the amplification path are serially coupled together.

7. The amplifier of claim 3 wherein:
   the first and third stages each have a respective pair of differential output nodes;
   the first offset compensation feedback path has a pair of differential input nodes respectively coupled to the differential output nodes of the first stage and has a pair of differential output nodes coupled to the second stage; and
   the second offset compensation feedback path has a pair of differential input nodes respectively coupled to the differential output nodes of the third stage and has a pair of differential output nodes coupled to the fourth stage.

8. The amplifier of claim 3 wherein:
   the output node of the first offset compensation feedback path is coupled to an offset adjuster of the second stage; and
   the output node of the second offset compensation feedback path is coupled to an offset adjuster of the fourth stage.

9. The amplifier of claim 3 wherein the first and second offset compensation feedback paths have bandwidths that are significantly less than the bandwidth of the amplification path.

10. The amplifier of claim 3 wherein:
    the amplification path has a bandwidth that is or is approximately 1 GHz or higher; and
    the first and second offset compensation feedback paths have bandwidths that are or are approximately 1/100 of the bandwidth of the amplification path or lower.

11. The amplifier of claim 3 wherein:
    the stage output nodes to which the offset compensation feedback paths are coupled carry respective offset signals; and
    the first and second offset compensation feedback paths are operable to maintain one or more of the offset signals at or approximately at a predetermined level.

12. The amplifier of claim 3 wherein:

the stage output nodes to which the offset compensation feedback paths are coupled carry respective output voltages having respective offset voltages; and the first and second offset compensation feedback paths are operable to maintain one or more of the offset voltages at or approximately at zero volts.

13. A fiber optic receiver, comprising:

a device operable to generate an electrical signal from a received optical signal; and an amplifier operable to generate an amplified electrical signal from the electrical signal, the amplifier comprising, an amplification path that includes an input node operable to receive the preamplified electrical signal, an output node operable to provide the amplified electrical signal, and multiple stages serially coupled between the input and output nodes and each having a respective stage output node that carries a respective offset signal, a first offset compensation feedback path having an input node coupled to the output node of a first one of the stages and having an output node coupled to a second one of the stages, a second offset compensation feedback path having an input node coupled to the output node of a third one of the stages and having an output node coupled to a fourth one of the stages, and wherein the first and second offset compensation feedback paths operate to maintain the offset signal on at least one of the stage output nodes at or approximately at a predetermined level.

14. The fiber optic receiver of claim 13 wherein:

the first offset compensation feedback path is operable to maintain the offset signal on the output node of the first stage at or approximately at the predetermined level; and the second offset compensation feedback path is operable to maintain the offset signal on the output node of the third stage at or approximately at the predetermined level.

15. The fiber optic receiver of claim 13 wherein the device comprises a photo diode.

16. The fiber optic receiver of claim 13, further comprising:

a preamplifier coupled between the photo diode and the amplifier and operable to convert the electrical signal from the photo diode into a differential preamplified electrical signal;

wherein the amplification path includes differential input nodes operable to receive the differential preamplified electrical signal and differential output nodes operable to provide a differential amplified electrical signal;

the stages each have respective differential stage output nodes that carry a respective differential offset signal;

the first offset compensation feedback path has differential input nodes coupled to the differential output nodes of the first stage and has differential compensation output nodes coupled to the second stage; and the second offset compensation feedback path has differential input nodes coupled to the differential output nodes of the third stage and has differential compensation output nodes coupled to the fourth stage.

17. The fiber optic receiver of claim 13 wherein:

the second one of the stages and the fourth one of the stages are a same stage; and the first and second offset compensation feedback paths comprise a common offset compensator circuit having a common input node coupled to the output nodes of the first and third ones of the stages and having a common output node coupled to the same stage.

18. A method, comprising:

detecting first and second differential offset signals at the output nodes of first and second stages of an amplifier, the first stage preceding the second stage; and maintaining at least one of the first and second differential offset signals at a predetermined level by providing to the first stages an offset-compensation signal that is related to the first and second differential offset signals.

19. The method of claim 18 wherein maintaining at least one of the offset signals at the predetermined level comprises generating the offset-compensation signal.

20. The method of claim 18 wherein maintaining at least one of the offset signals at a predetermined level comprises adjusting the offset of the first, second, and/or another stage of the amplifier.

21. The method of claim 18 wherein the first and second offset signals have bandwidths of or approximately of 0 Hz.

22. A method, comprising:

detecting first and second differential output signals at the output nodes of first and second stages of an amplifier, the first and second differential output signals having first and second differential offset components, respectively; and maintaining at least one of the first and second differential offset components at a predetermined level by providing to a non-input node of one of the stages an offset-compensation signal that is related to the first and second differential offset components.

23. A method, comprising:

detecting first and second differential output signals at the output nodes of first and second stages of an amplifier, the first and second differential output signals having first and second differential offset components, respectively;

maintaining at least one of the first and second differential offset components at a predetermined level by providing to one of the stages an offset-compensation signal that is related to the first and second differential offset components; and low pass filtering the first and second output signals to isolate the first and second offset components.

24. An amplifier, comprising:

an amplification path that includes first, second, and third stages each having a respective output node;

a first bi-directional offset-compensation feedback path having an input node coupled to the output node of the second stage and having an output node coupled to a node of the first stage other than the output node of the first stage; and a second bi-directional offset-compensation feedback path having an input node coupled to the output node of the third stage and having an output node coupled to a node of the first stage other than the output node of the first stage.

25. The amplifier of claim 24 wherein:

the first stage includes an offset-adjust node; and the output nodes of the first and second offset-compensation feedback paths are coupled to the offset-adjust node.

26. An amplifier, comprising:

an amplification path that includes multiple differential stages each having respective input nodes and output nodes; and multiple differential offset-compensation feed back paths having respective input nodes coupled to locations of the amplification path, at least one of the paths having an input node coupled to an output node of one of the stages and having an output node coupled to a location of the amplification path other than an input node of the one stage.

* * * * *